US011699900B2

(12) United States Patent
Lee (10) Patent No.: US 11,699,900 B2
(45) Date of Patent: Jul. 11, 2023

(54) SEMICONDUCTOR CHIP, ELECTRONIC DEVICE AND ELECTROSTATIC DISCHARGE PROTECTION METHOD FOR ELECTRONIC DEVICE THEREOF

(71) Applicant: NANYA TECHNOLOGY CORPORATION, New Taipei (TW)

(72) Inventor: Chun-Lu Lee, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 180 days.

(21) Appl. No.: 17/390,171

(22) Filed: Jul. 30, 2021

(65) Prior Publication Data

US 2023/0029798 A1 Feb. 2, 2023

(51) Int. Cl.
*H02H 9/04* (2006.01)
*H01L 23/60* (2006.01)
*G11C 29/52* (2006.01)
*H01L 25/065* (2023.01)
*H01L 27/02* (2006.01)

(52) U.S. Cl.
CPC ............ *H02H 9/046* (2013.01); *G11C 29/52* (2013.01); *H01L 23/60* (2013.01); *H01L 25/0657* (2013.01); *H01L 27/0248* (2013.01)

(58) Field of Classification Search
CPC ..... G11C 29/52; H01L 23/60; H01L 25/0657; H01L 27/0248; H02H 9/046
USPC .......................................................... 361/56
See application file for complete search history.

(56) References Cited

U.S. PATENT DOCUMENTS

| 10,476,263 | B2* | 11/2019 | Tzeng | ................... | H02H 9/041 |
| 2004/0252426 | A1* | 12/2004 | Hargrove | ............ | H01L 27/0255 361/56 |
| 2007/0267701 | A1* | 11/2007 | Sung | ................... | H01L 27/0266 257/365 |
| 2014/0160607 | A1* | 6/2014 | Reimann | ............ | H01L 27/0255 361/56 |
| 2018/0158533 | A1 | 6/2018 | Zhou et al. | | |
| 2019/0305549 | A1* | 10/2019 | Muljono | ................ | H02H 9/041 |

FOREIGN PATENT DOCUMENTS

| TW | 201106408 A1 | 2/2011 |
| TW | 201214668 A1 | 4/2012 |

* cited by examiner

*Primary Examiner* — Kevin J Comber
(74) *Attorney, Agent, or Firm* — Muncy, Geissler, Olds & Lowe, P.C.

(57) ABSTRACT

The present application discloses a semiconductor chip, an electronic device and an electrostatic discharge (ESD) protection method for an electronic device thereof. The semiconductor chip includes an operation electrical contact, a detection electrical contact, an ESD protection unit, and a logic circuit. The operation electrical contact receives an operation signal. The detection electrical contact receives a chip connection signal. The ESD protection unit is coupled to the operation electrical contact. The logic circuit is coupled to the detection electrical contact, and adjusts capacitance of the ESD protection unit according to a chip connection signal received by the detection electrical contact.

18 Claims, 10 Drawing Sheets

SEMICONDUCTOR CHIP, ELECTRONIC DEVICE AND ELECTROSTATIC DISCHARGE PROTECTION METHOD FOR ELECTRONIC DEVICE THEREOF

TECHNICAL FIELD

The present disclosure relates to a semiconductor chip, and more particularly, to a semiconductor chip including electrostatic discharge protection units of adjustable capacitance.

DISCUSSION OF THE BACKGROUND

Electrostatic discharge (ESD) occurs when two differently-charged objects contact with each other. For example, when a pad of a semiconductor chip contacts a charged object, such as human body or a circuit board, an ESD event would occur. In such case, a drastic discharge current will be induced on the pad of the semiconductor chip so as to discharge charges accumulated in the semiconductor chip or the charged object. To protect components in the semiconductor chip from being damaged by the drastic and intensive discharge current, ESD protection circuits are often added to pads of the semiconductor chip.

However, the ESD protection circuits often include capacitive elements, which may cause distortion to signals received by the pads. For example, a rise time and a fall time of a signal will be extended because the signal has to charge or discharge the capacitive elements. Furthermore, as signals have higher frequencies, it would be even more difficult to identify the data delivered by the signals. In addition, in a multi-chip device, such as a memory device including multiple stacked dynamic random access memory (DRAM) chips, the chips of different ranks may be coupled together for receiving the same signals and operating in parallel. In such case, those signals will have to charge or discharge capacitive elements in all of the chips that coupled together, thereby further deteriorate the quality of signals.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor chip including an operation electrical contact, a detection electrical contact, an electrostatic discharge (ESD) protection unit, and a logic circuit. The operation electrical contact receives an operation signal. The detection electrical contact receives a first chip connection signal. The ESD protection unit is coupled to the operation electrical contact. The logic circuit is coupled to the detection electrical contact, and adjusts capacitance of the ESD protection unit at least according to the first chip connection signal received by the detection electrical contact.

In some embodiments, the semiconductor chip further comprises a memory circuit configured to perform operations according to at least the operation signal received by the operation electrical contact.

In some embodiments, the semiconductor chip further comprises a notification electrical contact configured to transmit a second chip connection signal, and the logic circuit is further configured to generate the second chip connection signal to the notification electrical contact when the semiconductor chip is powered up.

In some embodiments, the ESD protection unit comprises a first ESD protection element coupled between the electrical contact and a voltage terminal, a second ESD protection element, and a control circuit coupled in series with the second ESD protection element between the operation electrical contact and the voltage terminal, wherein the voltage terminal is coupled to a ground or a power voltage.

In some embodiments, the control circuit comprises a switch, and the logic circuit is configured to turn on or turn off the switch for adjusting the capacitance of the ESD protection unit.

In some embodiments, the control circuit comprises a fuse, and the logic circuit is configured to burn out the fuse to decrease the capacitance of the ESD protection unit.

Another aspect of the present disclosure provides an electronic device comprising a first semiconductor chip and a second semiconductor chip. The first semiconductor chip comprises a first operation electrical contact, a first detection electrical contact, a first electrostatic discharge (ESD) protection unit coupled to the first operation electrical contact, and a first logic circuit coupled to the first detection electrical contact. The first logic circuit is configured to adjust capacitance of the first ESD protection unit according to at least a first chip connection signal received by the first detection electrical contact. The a second semiconductor chip comprises a second operation electrical contact coupled to the first operation electrical contact, a second detection electrical contact, a second electrostatic discharge (ESD) protection unit coupled to the second operation electrical contact, and a second logic circuit coupled to the second detection electrical contact. The second logic circuit is configured to adjust capacitance of the second ESD protection unit according to at least a second chip connection signal received by the second detection electrical contact.

In some embodiments, the first semiconductor chip further comprises a first notification electrical contact coupled to the second detection electrical contact of the second semiconductor chip, and configured to transmit the second chip connection signal. The first logic circuit is further configured to generate the second chip connection signal to the first notification electrical contact.

In some embodiments, the second semiconductor chip further comprises a second notification electrical contact coupled to the first detection electrical contact of the first semiconductor chip, and configured to transmit the first chip connection signal. The second logic circuit is further configured to generate the first chip connection signal to the second notification electrical contact.

In some embodiments, the first semiconductor chip further comprises a first memory circuit configured to perform operations according to at least an operation signal received by the first operation electrical contact, and the second semiconductor chip further comprises a second memory circuit configured to perform operations according to at least the operation signal.

In some embodiments, the electronic device further comprises a third semiconductor chip coupled to the first detection electrical contact of the first semiconductor chip and the second detection electrical contact of the second semiconductor chip. The third semiconductor chip comprises a memory control circuit configured to control the first memory circuit and the second memory circuit, and generate the first chip connection signal and the second chip connection signal.

In some embodiments, the memory control circuit is configured to generate the first chip connection signal and the second chip connection signal according to a total quantity of semiconductor chips in the electronic device that comprise memory circuits receiving the same operation signal and operating in parallel.

In some embodiments, the first ESD protection unit comprises a first ESD protection element coupled between the first operation electrical contact and a voltage terminal, a second ESD protection element, and a control circuit coupled in series with the second ESD protection element between the first operation electrical contact and the voltage terminal, wherein the voltage terminal is coupled to a ground or a voltage power VDD In some embodiments, the control circuit comprises a switch, and the first logic circuit is configured to turn on or turn off the switch for adjusting the capacitance of the first ESD protection unit.

In some embodiments, the control circuit comprises a fuse, and the first logic circuit is configured to burn out the fuse to decrease the capacitance of the first ESD protection unit.

In some embodiments, the electronic device further comprises a substrate, wherein the first semiconductor chip is disposed on the substrate, and the second semiconductor chip is stacked on the first semiconductor chip.

Another aspect of the present disclosure provides an ESD protection method for an electronic device. The electronic device comprising a plurality of semiconductor chips. The method comprises forming an ESD protection unit in each of the plurality of semiconductor chips, wherein the ESD protection unit is coupled between a voltage terminal and an operation electrical contact of the each of the plurality of semiconductor chips, coupling an operation electrical contact of a first semiconductor chip of the plurality of semiconductor chips to at least one operation electrical contact of at least one other semiconductor chip of the plurality of semiconductor chips, and adjusting capacitance of a plurality of ESD protection units of the plurality of semiconductor chips according to a total quantity of semiconductor chips in the electronic device. The voltage terminal is coupled to a ground or a power voltage.

In some embodiments, a first ESD protection units of the first semiconductor chip comprises a plurality of ESD protection elements coupled between a first operation electrical contact of the first semiconductor chip and the voltage terminal, and adjusting the capacitance of the plurality of ESD protection units of the plurality of semiconductor chips according to the total quantity of semiconductor chips in the electronic device comprises uncoupling at least one of the plurality of ESD protection elements from the first operation electrical contact or the voltage terminal.

In some embodiments, adjusting the capacitance of the plurality of ESD protection units of the plurality of semiconductor chips according to the total quantity of semiconductor chips in the electronic device is performed when the electronic device is powered up for a first time.

In some embodiments, each of the plurality of semiconductor chips comprises a memory circuit.

Since the semiconductor chip, the electronic device, and the ESD protection method for the electronic device thereof can adjust capacitance of ESD protection units according to the quantity of semiconductor chips that are coupled together for parallel operations, signal distortion caused by capacitance of the ESD protection units can be mitigated.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element or layer is referred to as being "connected to," or "coupled to" another element or layer, it can be directly connected to or coupled to another element or layer or intervening elements or layers may be present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device. Specifically, semiconductor devices of embodiments of the present disclosure may be dynamic random-access memory devices.

Figure 1:
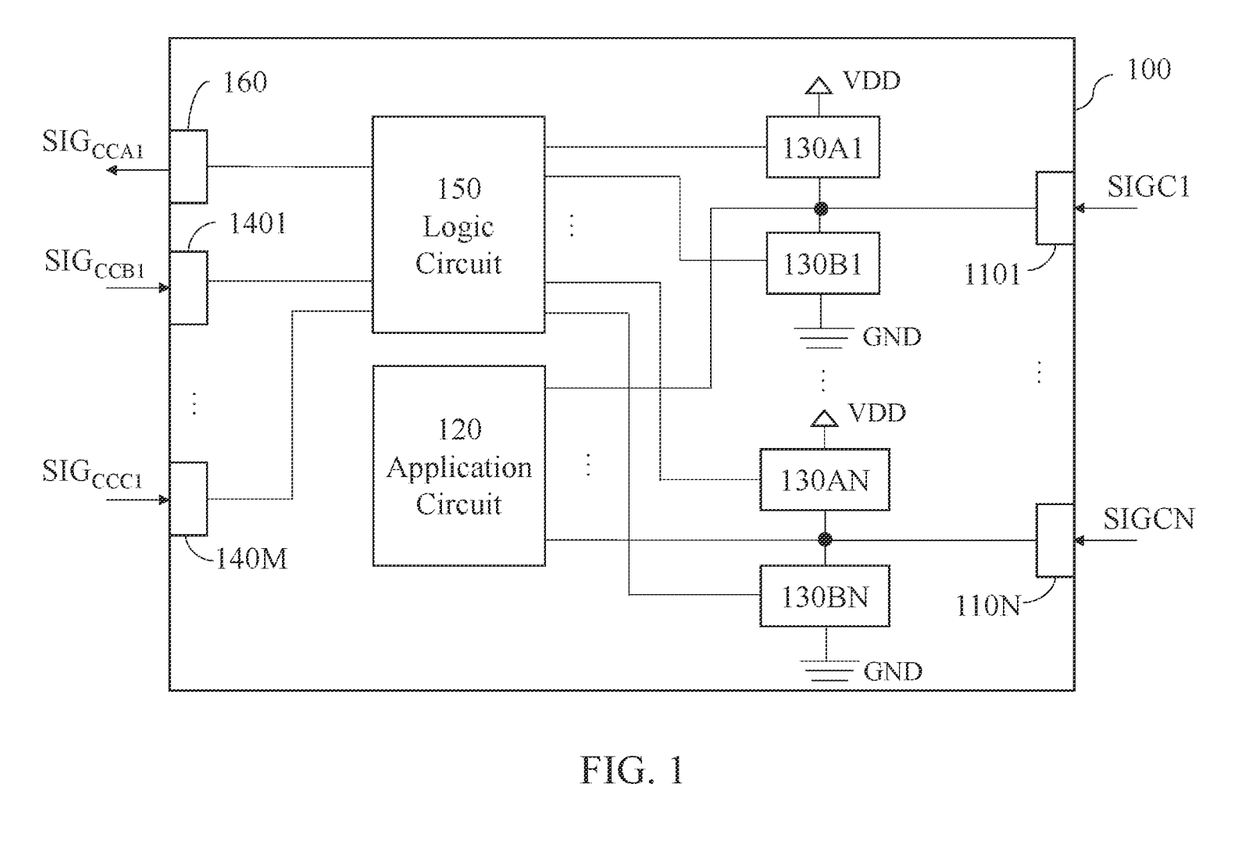
FIG. 1 shows a semiconductor chip according to one embodiment of the present disclosure.

FIG. 1 shows a semiconductor chip 100 according to one embodiment of the present disclosure. The semiconductor chip 100 includes operation electrical contacts 110₁ to 110N, a memory circuit 120, ESD protection units 130A₁ to 130AN and 130B₁ to 130BN, detection electrical contacts 140₁ to 140M, and logic circuit 150, where N and M are a positive integer. In some embodiments, N and M can be 1. In such case, the semiconductor chip 100 includes one operation electrical contact 110₁, one ESD protection unit 130A₁, one ESD protection unit 130B₁, and one detection electrical contact 140₁.

The operation electrical contacts 110₁ to 110N and the detection electrical contacts 140₁ to 140M can be pins, solder pads, micro bumps or other types of contact body for external connection. However, each of the operation electrical contacts 110₁ to 110N can receive an operation signal while each of the detection electrical contacts 140₁ to 140M can receive a chip connection signal. The memory circuit 120 can perform operations according to signals received by the operation electrical contacts 110₁ to 110N. For example, the memory circuit 120 can be a dynamic random access memory (DRAM) circuit. In such case, the operation electrical contacts 110₁ to 110N may receive read/write commands, addresses or data corresponding to the commands, and the memory circuit 120 can perform read operations or write operations according to the commands, and transmit the requested data accordingly.

Since the operation electrical contacts 110₁ to 110N are used for external connection, ESD protection units 130A₁ to 130AN and 130B₁ to 130BN are coupled to the operation electrical contacts 110₁ to 110N for providing discharge paths at the electrical contacts 110₁ to 110N, thereby preventing the discharge currents from damaging the memory circuit 120. As shown in FIG. 1, each of the ESD protection units 130A₁ to 130AN and 130B₁ to 130BN is coupled to a corresponding electrical contact of the operation electrical contacts 110₁ to 110N. For example, the ESD protection unit 130A₁ is coupled to the operation electrical contact 110₁, and the ESD protection unit 130AN is coupled to the operation electrical contact 110N.

Since the ESD protection units 130A₁ to 130AN and 130B₁ to 130BN are capacitive, operation signals $SIG_{C1}$ to $SIG_{CN}$ received by the operation electrical contacts 110₁ to 110N need to charge or discharge the equivalent capacitors or parasitic capacitors of the ESD protection units 130A₁ to 130AN and 130B₁ to 130BN before the memory circuit 120 can sense the signals correctly. That is, the signals are distorted due to the capacitance of the ESD protection units 130A₁ to 130AN and 130B₁ to 130BN. Furthermore, in some embodiments, the semiconductor chip 100 may be coupled to other semiconductor chips and may receive the same signals with those semiconductor chips to perform operations in parallel. For example, the semiconductor chip 100 and the other semiconductor chips may be corresponding to different ranks of memory, and the semiconductor chip 100 and those semiconductor chips would receive the same signals and perform read/write operations in parallel. In such case, signals sent to the electrical contacts of the semiconductor chip 100 and those semiconductor chips will have to charge the equivalent capacitors of the ESD protection units of all the semiconductor chips. Therefore, distortion of signals become even severe.

To mitigate such distortion, when the semiconductor chip 100 is coupled to other semiconductor chips, the semiconductor chip 100 can receive chip connection signals through the detection electrical contact 140₁ to 140M, so that the semiconductor chip 100 can be notify of the existence of other connected chips. As a result, the logic circuit 150 coupled to the detection electrical contacts 140₁ to 140M can adjust capacitance of the ESD protection units 130A₁ to 130AN and 130B₁ to 130BN according to the chip connection signals received by the detection electrical contacts 140₁ to 140M. In some embodiments, the logic circuit 150 can be aware of the quantity of the semiconductor chips being coupled to the semiconductor chip 100 according to the chip connection signals received by the detection electrical contacts 140₁ to 140M, and adjust the capacitance of the ESD protection units 130A₁ to 130AN and 130B₁ to 130BN according to quantity of semiconductor chips being coupled to the semiconductor chip 100. For example, in some embodiments, the quantity of the semiconductor chips being coupled to the semiconductor chip 100 can be learned by calculating the quantity of detection electrical contacts that receive chip connection signals. For example, as shown in FIG. 1, if the detection electrical contacts 140₁ and 140M are the only two detection electrical contacts that receive the chip connection signals $SIG_{CCB1}$ and $SIG_{CCC1}$, the logic circuit 150 would assume that there are two semiconductor chips coupled to the semiconductor chip 100 and adjust the capacitance of the ESD protection units 130A1 to 130AN and 130B1 to 130BN accordingly.

Similarly, to notify other semiconductor chips of the existence of the semiconductor chip 100, the semiconductor chip 100 further includes a notification electrical contact 160 as shown in FIG. 1. In the present embodiment, the logic circuit 160 can generate a chip connection signal $SIG_{CCA1}$ to the notification electrical contact 160 when the semiconductor chip 100 is powered up, and the notification electrical contact 160 can transmit the chip connection signal $SIG_{CCA1}$ to other semiconductor chips that are coupled to the semiconductor chip 100, so that the logic circuits of those semiconductor chips can adjust capacitance of their ESD protection units accordingly.

Figure 2:
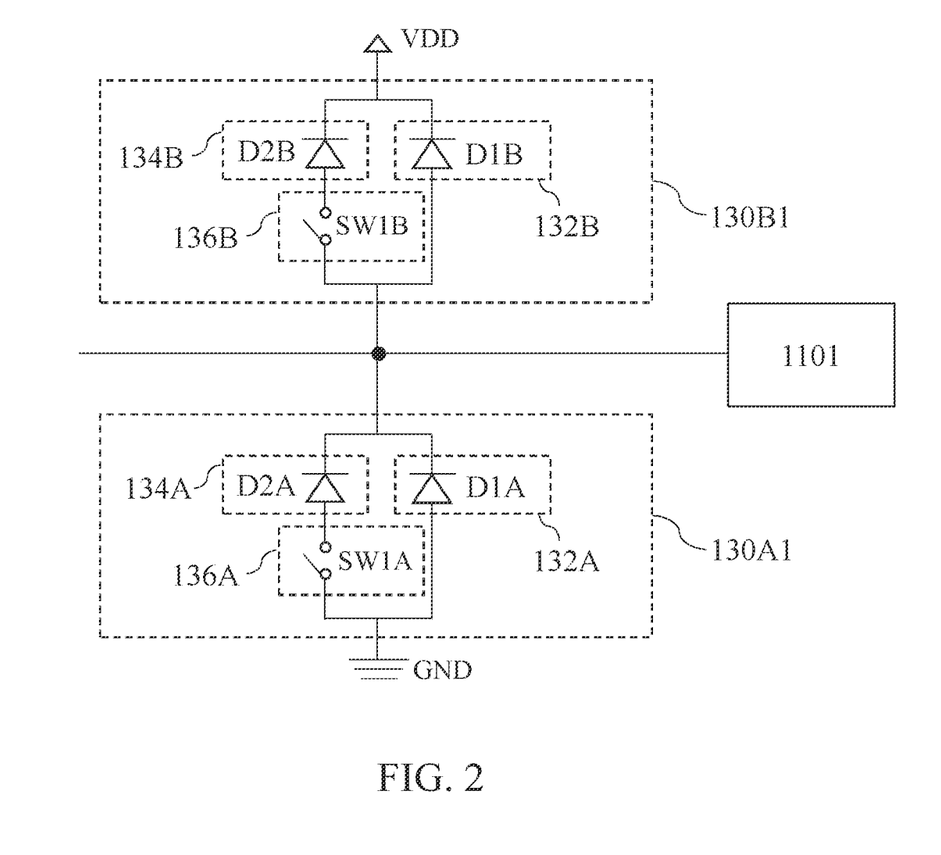
FIG. 2 shows the ESD protection units in FIG. 1 according to one embodiment of the present disclosure.

FIG. 2 shows the ESD protection units 130A1 and 130B1 according to one embodiment of the present disclosure. In the present embodiments, the ESD protection units 130A1 to 130AN and 130B1 to 130BN can have the same structures. As shown in FIG. 2, the ESD protection unit 130A1 includes a first ESD protection element 132A, a second ESD protection element 134A, and a control circuit 136A.

The first ESD protection element 132A is coupled between the operation electrical contact 1101 and the ground GND, and the second ESD protection element 134A is coupled between the operation electrical contact 1101 and the ground GND. The first ESD protection element 132A has first capacitance, and the second ESD protection element 134A has second capacitance.

Since the first ESD protection element 132A and the second ESD protection element 134A are coupled in parallel between the operation electrical contact 1101 and the ground GND, the equivalent capacitance of the ESD protection unit 130A1 is substantially the sum of the first capacitance of the first ESD protection element 132A and the second capacitance of the second ESD protection element 134A. In the present embodiment, to allow the logic circuit 150 to adjust the capacitance of the ESD protection unit 130A 1, the control circuit 136A can be coupled in series with the second ESD protection element 134A between the operation electrical contact 1101 and the ground GND. As shown in FIG. 2, the control circuit 136A includes a switch SW1A. In such case, the logic circuit 150 can turn off the switch SW1A to uncouple the second ESD protection element 134A from the operation electrical contact 1101 or the ground GND, so the second ESD protection element 134A will not be used to provide discharge paths between the operation electrical contact 1101 and the ground GND, and the capacitance of the first ESD protection unit 130A1 is decreased. That is, by turning on or turning off the switch SW1A, the logic circuit 150 is able to adjust the capacitance of the first ESD protection unit 130A1 according to system requirements.

As shown in FIG. 2, the first ESD protection element 132A includes a diode D1A. The diode D1A has an anode coupled to the ground GND, and a cathode coupled to the operation electrical contact 1101. Similarly, the second ESD protection element 134A also includes a diode D2A having an anode coupled to the ground GND, and a cathode coupled to the first operation electrical contact 1101. In some embodiments, the diodes D1A and D2A may have the same sizes. In such case, the first capacitance of the first ESD protection element 132A can be substantially equal to the second capacitance of the second ESD protection element 134A. However, the present disclosure is not limited thereto. In some other embodiments, the diodes D1A and D2A may have different sizes, and the first capacitance of the first ESD protection element 132A can be different from the second capacitance of the second ESD protection element 134A. Furthermore, in some other embodiments, the first ESD protection element 132A and the second ESD protection element 134A may include other types of components, such as capacitors, resistors, and/or transistors.

Similarly, the ESD protection unit 130B1 includes a first ESD protection element 132B, a second ESD protection element 134B, and a control circuit 136B. However, the ESD protection unit 130B1 can be coupled between the first operation electrical contact 1101 and a power voltage VDD. That is, the ESD protection unit 130B1 can be used to provide another discharge path to the power voltage VDD for ESD protection. For example, the control circuit 136B includes a switch SW1B, and the logic circuit 150 can turn off the switch SW1B to uncouple the second ESD protection element 134B from the operation electrical contact 1101 or the power voltage VDD. The diode D1B of the first ESD protection element 132B has an anode coupled to the first operation electrical contact 1101, and a cathode coupled to the power voltage VDD. Similarly, the diode D2B of the second ESD protection element 134B has an anode coupled to the first operation electrical contact 1101, and a cathode coupled to the power voltage VDD. That is, the ESD protection units 130A1 to 130AN can be used to provide discharging paths to the ground GND, and the ESD protection units 130B1 to 130BN can be used to provide discharging paths to the power voltage VDD. However, the present disclosure is not limited thereto. In some other embodiments, the semiconductor chip 100 may omit some of the ESD protection units 130A1 to 130AN and 130B1 to 130BN according to system requirements. For example, in some embodiments, the semiconductor chip 100 may include the ESD protection units 130A1 to 130AN and omit the ESD protection units 130B1 to 130BN if the ESD events on the power voltage VDD can be ignored.

Figure 3:
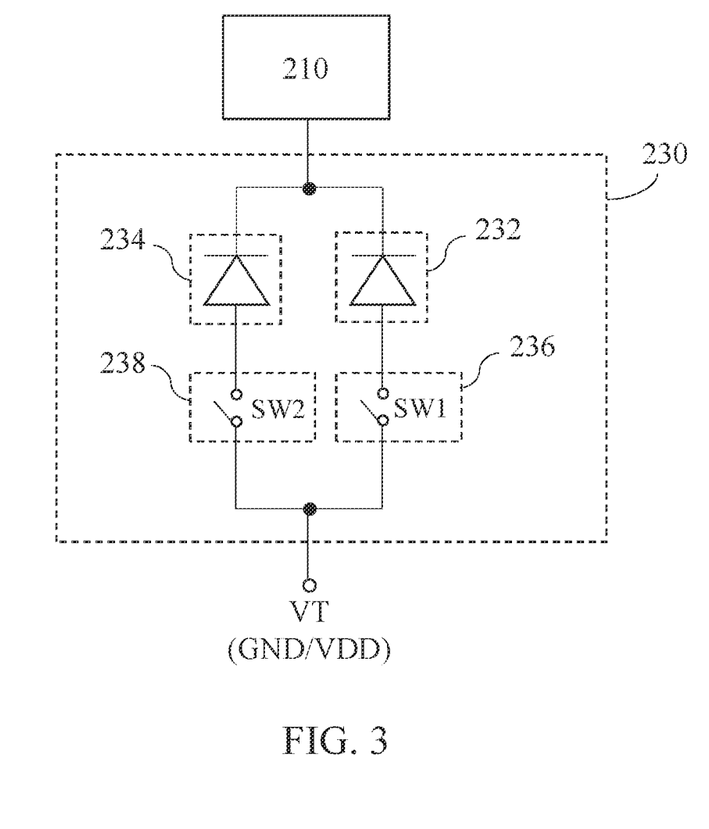
FIG. 3 shows an ESD protection unit according to another embodiment of the present disclosure.

FIG. 3 shows an ESD protection unit 230 according to one embodiment of the present disclosure. In some embodiments, the ESD protection unit 230 can be used to replace the ESD protection units 130A1 to 130AN and 130B1 to 130BN in the semiconductor chip 100. As shown in FIG. 3, the ESD protection unit 230 include a first ESD protection element 232, a second ESD protection element 234, a first control circuit 236 and a second control circuit 238. The first control circuit 236 is coupled in series with the first ESD protection element 232 between an operation electrical contact 210 and a voltage terminal VT, and the second control circuit 238 is coupled in series with the second ESD protection element 234 between the operation electrical contact 210 and the voltage terminal VT. The voltage terminal VT can be coupled to the ground GND or the power voltage VDD. In addition, the capacitance of the first ESD protection element 232 and the capacitance of the second ESD protection element 234 can be different. In the case that each of the ESD protection units 130A1 to 130AN and 130B1 to 130BN is replaced by the ESD protection unit 230, the manufacturer may decide to turn off the switch SW1 of the first control circuit 236 or the switch SW2 of the second control circuit 238 for providing the ESD protection with the desired capacitance according to requirements. In some embodiments, the ESD protection unit 230 may further include more ESD protection elements and control circuits so as to provide more options of capacitance.

Figure 4:
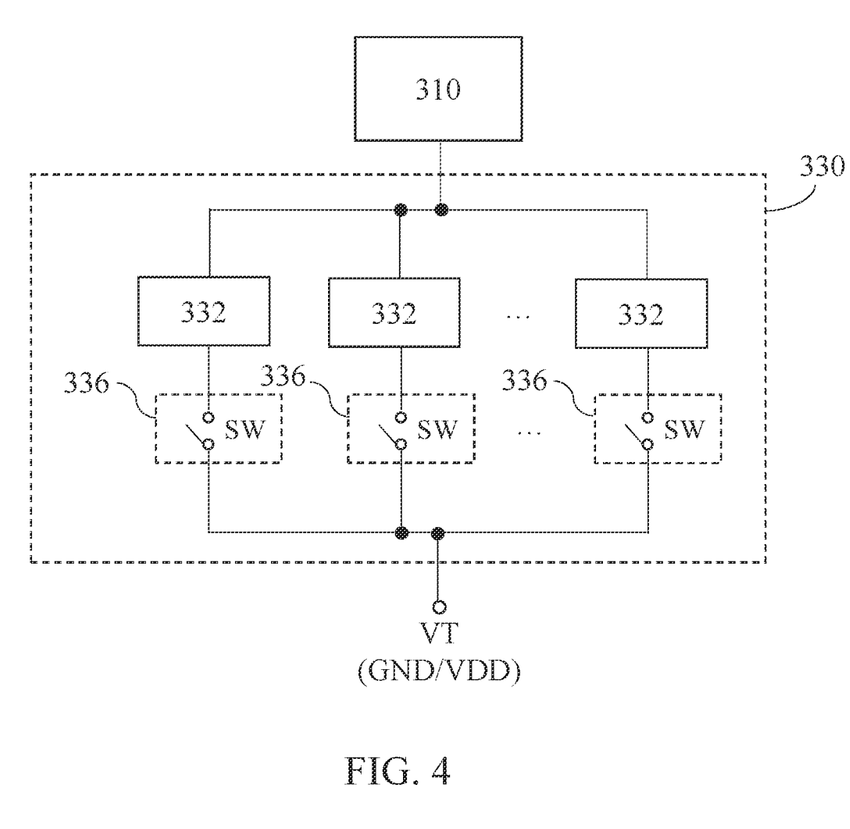
FIG. 4 shows an ESD protection unit according to another embodiment of the present disclosure.

FIG. 4 shows an ESD protection unit 330 according to another embodiment of the present disclosure. In the present embodiments, the ESD protection unit 330 can be used to implement the ESD protection units 130A 1 to 130AN and 130B1 to 130BN of the semiconductor chip 100. As shown in FIG. 4, the ESD protection unit 330 includes a plurality of ESD protection elements 332, and a plurality of control circuits 336. Each of the ESD protection element 332 is coupled in series with a control circuit 336 between the operation electrical contact 310 and the voltage terminal VT, and the voltage terminal VT can be coupled to the ground GND or the power voltage VDD. In such case, by turning on different quantity of switches SW of the control circuits 336, the ESD protection unit 330 can be adjusted to have different capacitance. That is, by including more ESD protection elements 332 and control circuits 336, it allows the ESD protection unit 330 to provide more options of different capacitances.

Figure 5:
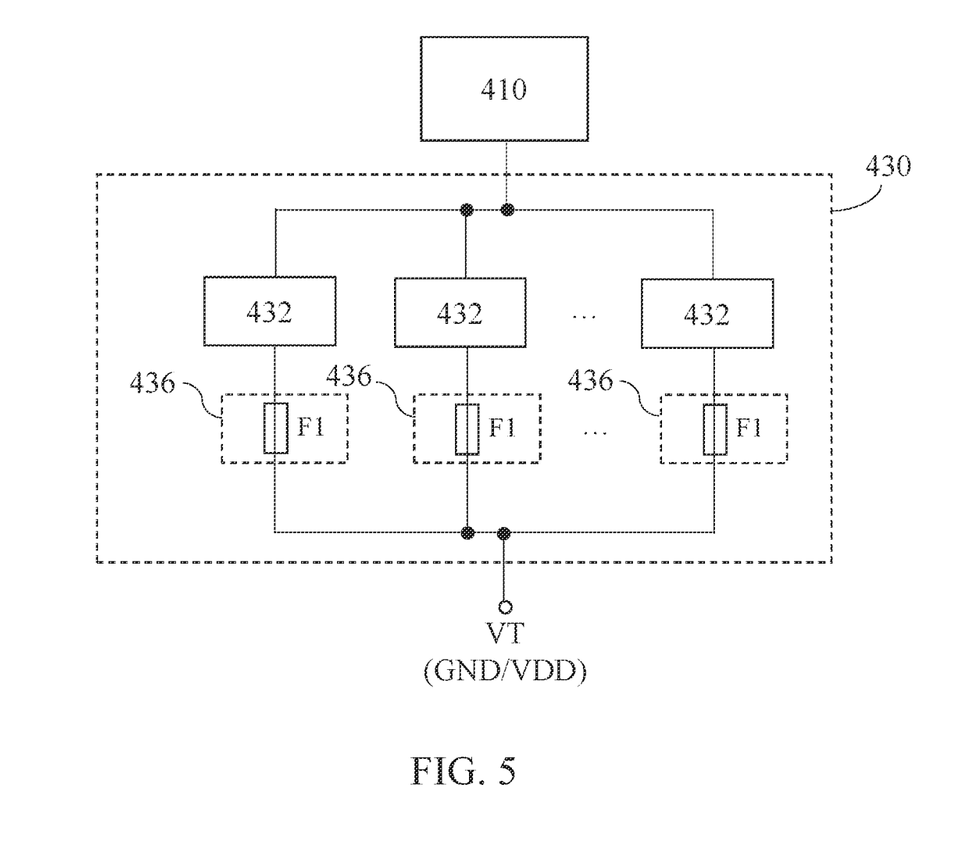
FIG. 5 shows an ESD protection unit according to another embodiment of the present disclosure.

In some embodiments, the control circuit can include switch that can be turned on or turned off. However, the present disclosure is not limited thereto. In some embodiment, the control circuit may include fuses. FIG. 5 shows an ESD protection unit 430 according to another embodiment of the present disclosure. In the present embodiments, the ESD protection unit 430 can be used to implement the ESD protection units 130A1 to 130AN and 130B1 to 130BN of the semiconductor chip 100. As shown in FIG. 5, the ESD protection unit 430 includes a plurality of ESD protection elements 432, and a plurality of control circuits 436. Each of the ESD protection element 432 is coupled in series with a control circuit 436 between the operation electrical contact 410 and the voltage terminal VT. In such case, by burning out different quantities of fuses F1 of the control circuits 436, the ESD protection unit 430 can be adjusted to have different capacitance. In some embodiments, the semiconductor chip 100 may further include other circuits or components (not shown in FIG. 5) for controlling the fuses F1 of the control circuits 436 so that the fuses F1 can be burned without damaging other components in the semiconductor chip 100.

Figure 6:
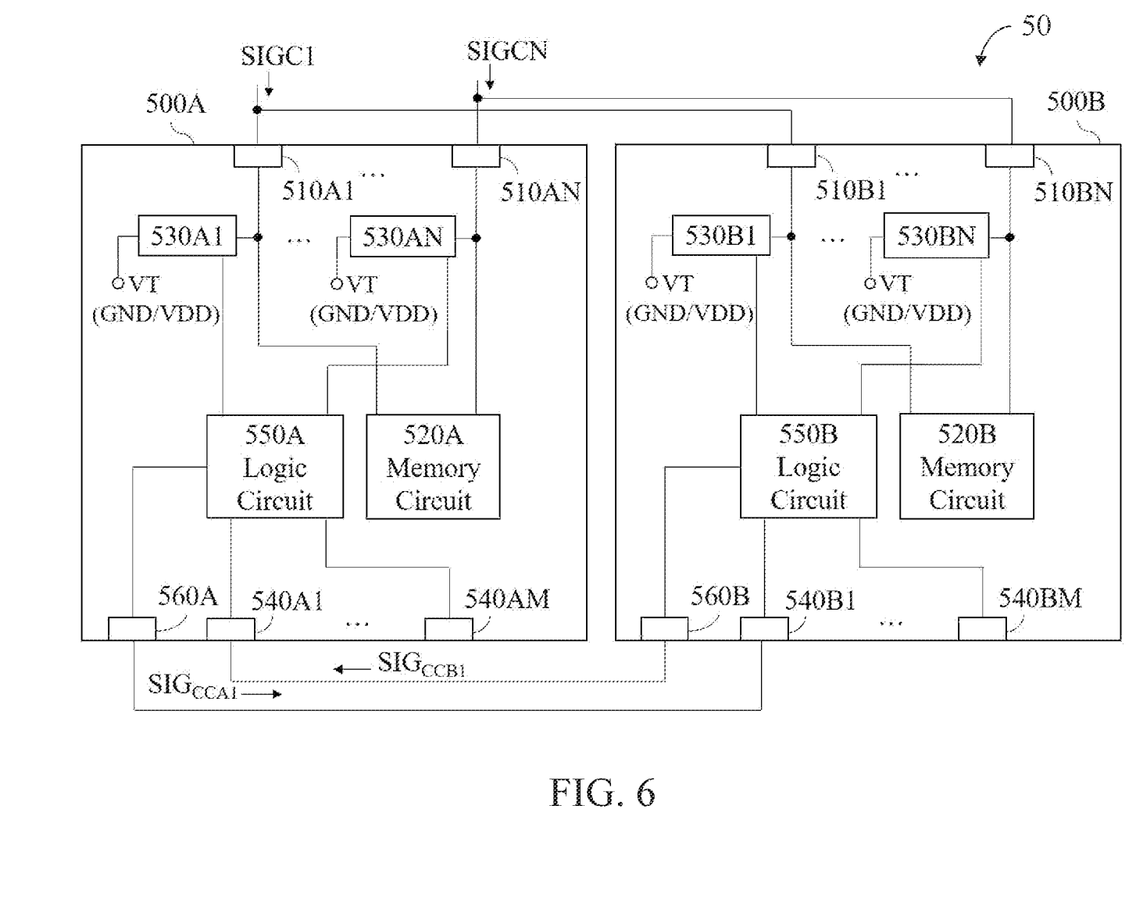
FIG. 6 shows an electronic device according to one embodiment of the present disclosure.

FIG. 6 shows an electronic device 50 according to one embodiment of the present disclosure. The electronic device 50 includes a first semiconductor chip 500A and a second semiconductor chip 500B. In the present embodiment, the semiconductor chips 500A and 500B can have the same structure. For example, as shown in FIG. 6, the first semiconductor chip 500A includes first operation electrical contacts 510A1 to 510AN, a first memory circuit 520A, first ESD protection units 530A1 to 530AN, first detection electrical contacts 540A1 to 540AM, and a first logic circuit 550A. Also, the second semiconductor chip 500B includes second operation electrical contacts 510B1 to 510BN, a second memory circuit 520B, second ESD protection units 530B1 to 530BN, second detection electrical contacts 540B1 to 540BM, and a second logic circuit 550B.

Furthermore, as shown in FIG. 6, each of the first operation electrical contacts 510A1 to 510AN is coupled to a corresponding operation electrical contact of the second operation electrical contacts 510B1 to 510BN for receiving a same signal. For example, the electronic device 50 can be a memory system, and the first memory circuit 520A and the second memory circuit 520B can be DRAM circuits that are combined to provide a wider bandwidth and a larger memory space for the electronic device 50. In such case, the first operation electrical contacts 510A1 to 510AN and the second operation electrical contacts 510B1 to 510BN can be used to receive the same signals. For example, the first operation electrical contact 510A1 and the second operation electrical contact 510B1 can be coupled together for receiving a signal SIGC1. In some embodiments, the semiconductor chips 500A and 500B can be stacked so as to reduce the area required by the electronic device 50.

Figure 7:
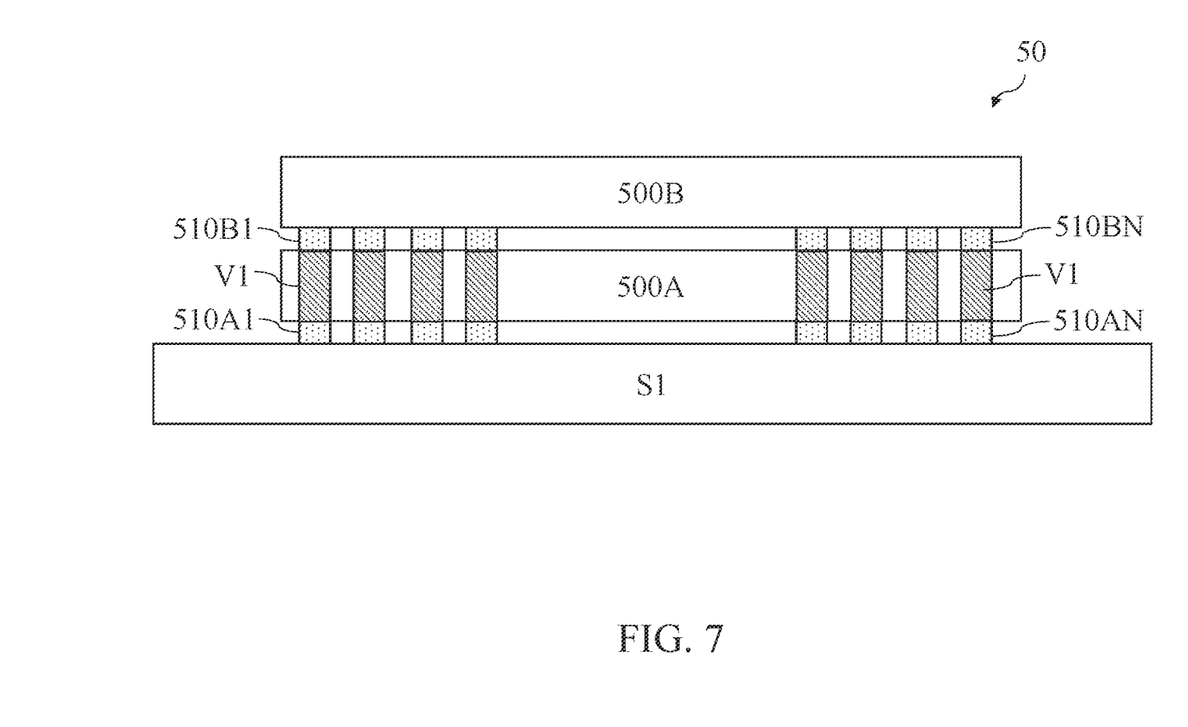
FIG. 7 a structure of the electronic device in FIG. 6 according to one embodiment.

FIG. 7 shows a structure of the electronic device 50 according to one embodiment. As shown in FIG. 7, the electronic device 50 further includes a substrate S1. The first semiconductor chip 500A is disposed on the substrate S1, and the second semiconductor chip 500B is stacked on the first semiconductor chip 500A. In the present embodiments, each of the second operation electrical contacts 510B1 to 510BN can be coupled to a corresponding one of the first operation electrical contacts 510A1 to 510AN by a through silicon via (TSV) V1. However, the present disclosure is not limited thereto. For example, in some other embodiments, the second semiconductor chip 500B may be stacked on the first semiconductor chip 500A without covering the first operation electrical contacts 510A1 to 510AN so the second operation electrical contacts 510B1 to 510BN can be coupled to the first operation electrical contacts 510A1 to 510AN by wiring bonding. However, the present disclosure does not limit that the first semiconductor chip 500A and the second semiconductor chip 500B are stacked. In some other embodiments, the first semiconductor chip 500A and the second semiconductor chip 500B may be placed with other structures.

Since the first ESD protection unit 530A1 and the second ESD protection unit 530B1 are capacitive, the signal SIGC1 needs to charge the equivalent capacitors or the parasitic capacitors of the first ESD protection unit 530A1 and the second ESD protection unit 530B1 before the actual voltage of the signal SIGC1 can be sensed by the first memory circuit 520A and the second memory circuit 520B. Therefore, the signal SIGC1 is distorted due to the capacitance of the first ESD protection unit 530A1 and the second ESD protection unit 530B1.

To mitigate the distortion of the signal SIGC1, the capacitance of the first ESD protection unit 530A1 and the second ESD protection unit 530B1 can be adjusted. For example, the first ESD protection unit 530A1 and the second ESD protection unit 530B1 can have the same structure as the structure of the ESD protection unit 130A1 or 130B1 shown in FIG. 2. In such case, the logic circuit 550A can turn off the switch in the first ESD protection unit 530A1 and the logic circuit 550B can turn off the switch in the second ESD protection unit 530B1, so the capacitance of each of the first ESD protection unit 530A1 and the second ESD protection unit 530B1 can be reduced.

Since the first operation electrical contact 510A1 is coupled to the second operation electrical contact 510B1, the first ESD protection unit 530A1 and the second ESD protection unit 530B1 can both be used to provide discharging paths during ESD events. Therefore, even though some of switches in the first ESD protection unit 530A1 and the second ESD protection unit 530B1 are turned off, the remaining ESD protection elements in the first ESD protection unit 530A1 and the second ESD protection unit 530B1 can still provide sufficient protection to the first semiconductor chip 500A and the second semiconductor chip 500B. However, the present disclosure does not limit to implement the first ESD protection units 530A1 to 530AN and the second ESD protection units 530B1 to 530BN with the ESD protection unit 130A1 or 130B1 shown in FIG. 2. In some other embodiments, the ESD protection unit 230 shown in FIG. 3, the ESD protection unit 330 shown in FIG. 4, or the ESD protection unit 430 shown in FIG. 5 can be adopted to implement the first ESD protection units 530A1 to 530AN and the second ESD protection units 530B1 to 530BN according to system requirements.

In the present embodiment, the first logic circuit 550A can adjust capacitance of the first ESD protection units 530A1 to 530AN according to the first chip connection signals received by the first detection electrical contacts 540A1 to 540AM. As shown in FIG. 6, since the first detection electrical contact 540A1 is the only one of the first detection electrical contacts 540A1 to 540AM that receives the first chip connection signal $SIG_{CCB1}$, the logic circuit 550A can be notified that there is only one semiconductor chip coupled to the first semiconductor chip 500A and thus adjust the capacitance of the first ESD protection units 530A1 to 530AN accordingly.

Similarly, the second logic circuit 550B can adjust capacitance of the second ESD protection units 530B1 to 530BN according to the second chip connection signals received by the second detection electrical contacts 540B1 to 540BM. As shown in FIG. 6, since the second detection electrical contact 540B1 is the only one of the second detection electrical contacts 540B1 to 540BM that receives the second chip connection signal $SIG_{CCA1}$, the logic circuit 550B can be notified that there is only one semiconductor chip coupled to the second semiconductor chip 500B and thus adjust the capacitance of the second ESD protection units 530B1 to 530BN accordingly.

Furthermore, in the present embodiment, the first semiconductor chip 500A further includes a first notification electrical contact 560A coupled to the second detection electrical contact 540B1, and the second semiconductor chip 500B further includes a second notification electrical contact 560B coupled to the first detection electrical contact 540A1, as shown FIG. 6. In such case, the first logic circuit 550A can further be used to generate the second chip connection signal $SIG_{CCA1}$, and the second logic circuit 550B can further be used to generate the first chip connection signal $SIG_{CCB1}$. That is, the semiconductor chips 500A and 500B can notify each other of their own existence. In some embodiments, the logic circuits 550A and 550B can generate the chip connection signals $SIG_{CCB1}$ and $SIG_{CCA1}$ by raising voltages of the notification electrical contacts 540A1 and 540B1.

As shown in FIG. 6, each of the first ESD protection units 530A1 to 530AN can be coupled between a first operation electrical contact of the first operation electrical contacts 510A1 to 510AN and the voltage terminal VT, and each of the second ESD protection units 530B1 to 530BN can be coupled between a second operation electrical contact of the second operation electrical contacts 510B1 to 510BN and the voltage terminal VT, where the voltage terminals VT can be coupled to the ground GND or the power voltage VDD according to the system requirements. In some other embodiments, to provide discharging paths to both the ground GND and the power voltage VDD, the first semiconductor chip 500A and the second semiconductor chip 500B may include more ESD protection units so that each of the electrical contacts 510A1 to 510AN and 510B1 to 510B1 can be protected by two ESD protection units, one coupled to the ground GND and another coupled the power voltage VDD, as shown in FIG. 1 and FIG. 2.

Figure 8:
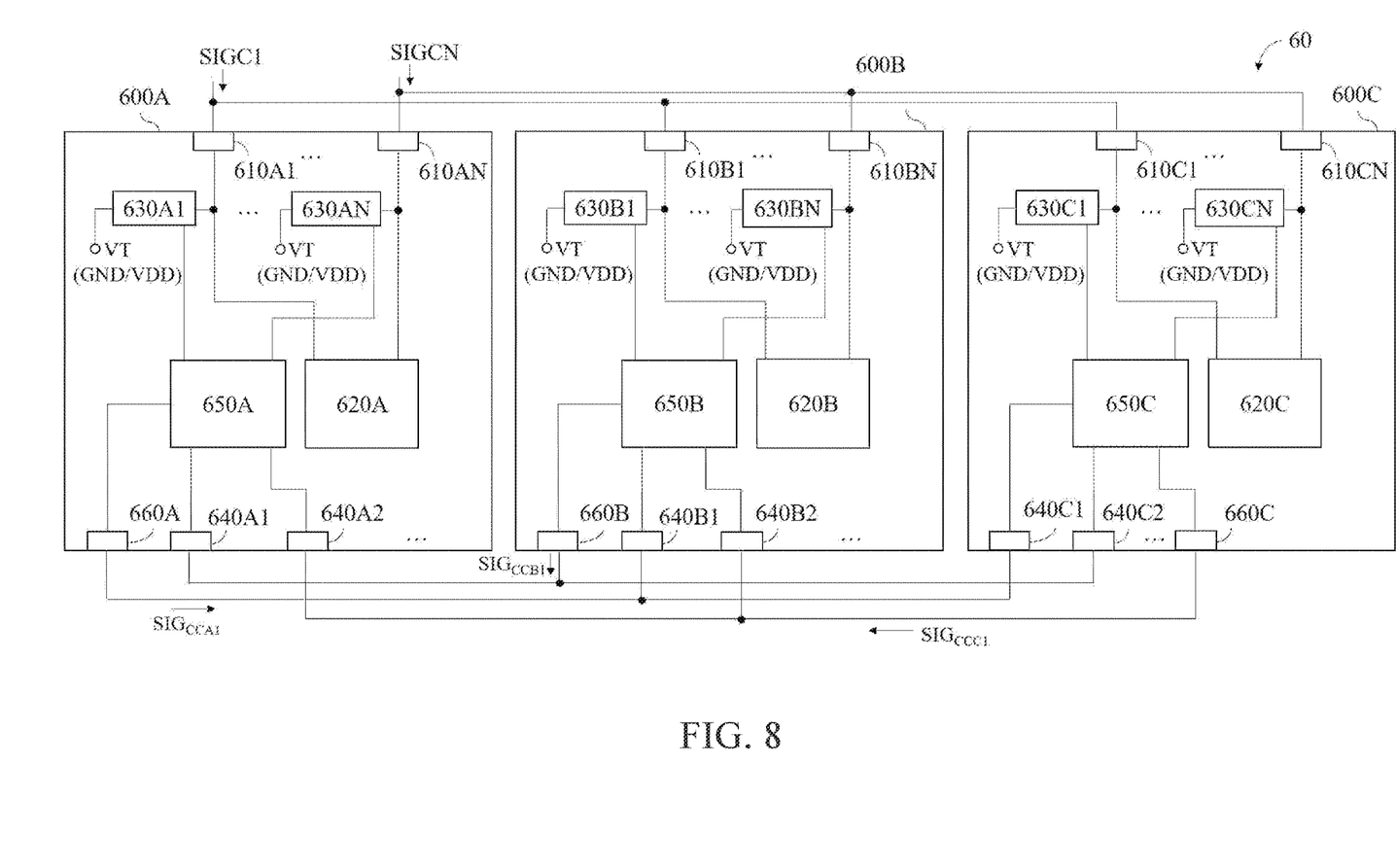
FIG. 8 shows an electronic device according to another embodiment of the present disclosure.

FIG. 8 shows an electronic device 60 according to one embodiment of the present disclosure. The electronic device 60 includes a first semiconductor chip 600A, a second semiconductor chip 600B, and a third semiconductor chip 600C. In the present embodiment, the semiconductor chips 600A, 600B and 600C can have the same structures as the semiconductor chips 500A and 500B. As shown in FIG. 8, the first operation electrical contacts 610A1 to 610AN of the first semiconductor chip 600A are coupled to the second operation electrical contacts 610B1 to 610BN of the second semiconductor chip 500B and the third operation electrical contacts 610C1 to 610CN of the third semiconductor chip 600C so that the memory circuits 620A, 620B, and 620C can receive the same signals and perform the same operations in parallel.

Furthermore, as shown in FIG. 8, the first logic circuit 650A of the first semiconductor 600A can generate the chip connection signal $SIG_{CCA1}$ to the detection electrical contacts 640B1 and 640C1 through the first notification electrical contact 660A1, the logic circuit 650B of the second semiconductor 600B can generate the chip connection signal $SIG_{CCB1}$ to the detection electrical contacts 640A1 and 640C2 through the second notification electrical contact 660B1, and the third logic circuit 650C of the third semiconductor 600C can generate the chip connection signal $SIG_{CCC1}$ to the detection electrical contacts 640A2 and 640B2 through the third notification electrical contact 660C1. Since only two of the first detection electrical contacts 640A1 to 640AM receive the chip connection signals $SIG_{CCB1}$ and $SIG_{CCC1}$, the first logic circuit 650A can be notified that there are two semiconductor chips being coupled to the first semiconductor chip 600A, and the first logic circuit 650A can adjust the capacitance of the first ESD protection units 630A1 to 630AN accordingly. Similarly, the logic circuits 650B and 650C can also adjust the capacitance of the second ESD protection units 630B1 to 630BN and the capacitance of the third ESD protection units 630C1 to 630CN accordingly.

Figure 9:
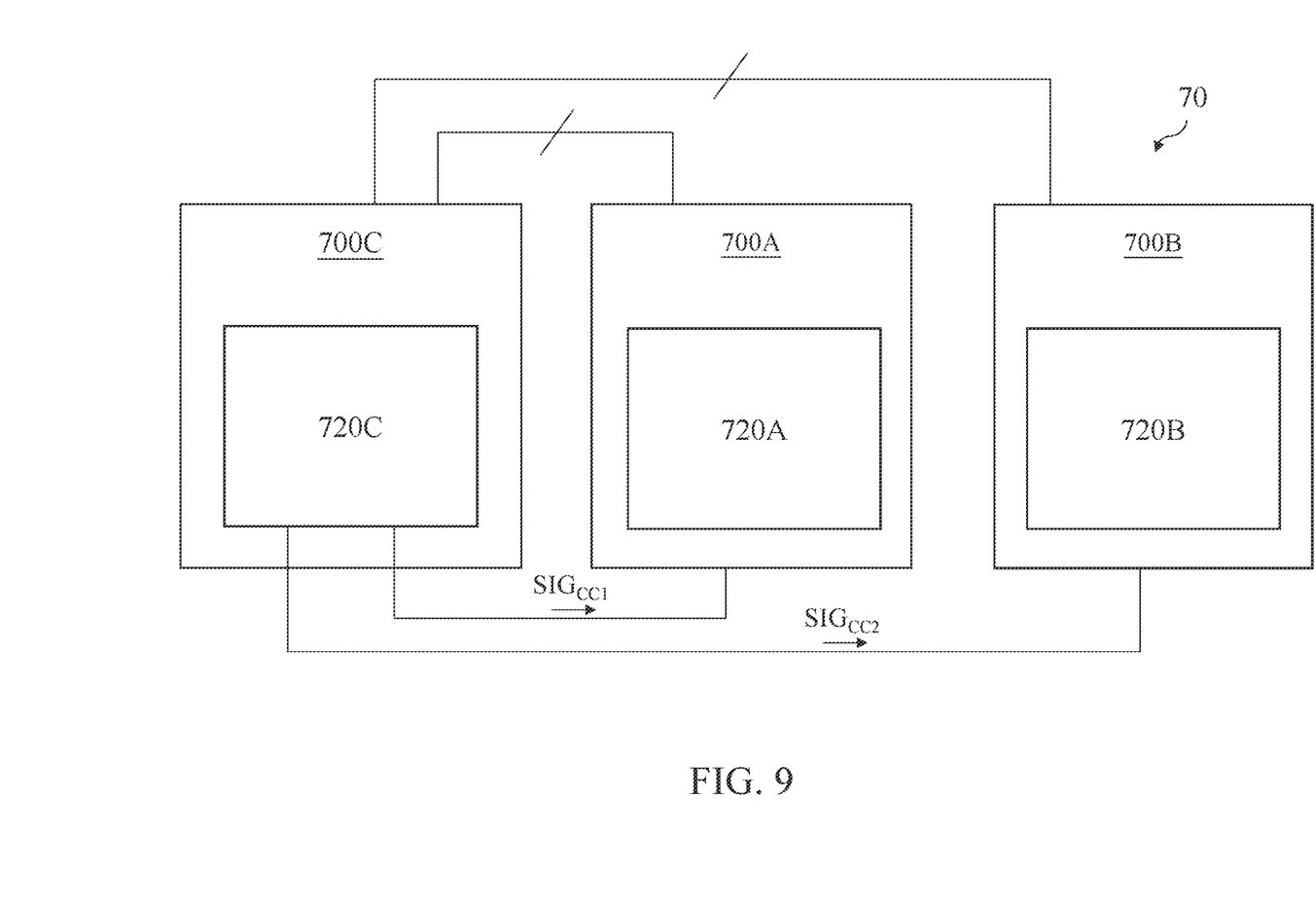
FIG. 9 shows an electronic device according to another embodiment of the present disclosure.

Although the semiconductor chips 600A, 600B, and 600C can notify each other of their existence by generating and sending chip connection signals, the present disclosure is not limited thereto. FIG. 9 shows an electronic device 70 according to one embodiment of the present disclosure. The electronic device 70 includes a first semiconductor chip 700A, a second semiconductor chip 700B, and a third semiconductor chip 700C. The first semiconductor chip 700A and the second semiconductor chip 700B can have the similar structures as the first semiconductor chip 500A and the second semiconductor chip 500B as shown in FIG. 6. However, while the semiconductor chips 700A and 700B include the memory circuits 720A and 720B for storing data, the semiconductor chip 700C can be coupled to first semiconductor chip 700A and the second semiconductor chip 700B and include a memory control circuit 720C for controlling the memory circuits 720A and 720B. Furthermore, since the memory control circuit 720C needs to communicate with the memory circuits 720A and 720B, the memory control circuit 720C must aware of the existence of the semiconductor chips 700A and 700B. Therefore, in the present embodiment, the memory control circuit 720C can further generate the first chip connection signal $SIG_{CC1}$ and the second chip connection signal $SIG_{CC2}$ to the semiconductor chips 700A and 700B. That is, the memory control circuit 720C can generate the first chip connection signal $SIG_{CC1}$ and the second chip connection signal $SIG_{CC2}$ according to a total quantity of semiconductor chips in the electronic device 70 that comprise memory circuits receiving the same operation signals.

As shown in FIG. 8, since the semiconductor chips 600A, 600B, and 600C can be aware of the existence of the other semiconductor chips only after they receive the chip connection signals from each other, the semiconductor chips 600A, 600B, and 600C can only generate the chip connection signals based on their own existence. Therefore, each of the semiconductor chips 600A, 600B, and 600C may include a plurality of detection electrical contacts for receiving the chip connection signals and determine the total quantity of semiconductor chips that are coupled together for parallel operation according to the quantity of chip connection signals they received. However, as shown in FIG. 9, since the memory control circuit 720C can aware of the total quantity of semiconductor chips that receive the same operation signal and operates in parallel in advance, the memory control circuit 720C can generate chip connection signal in a different format so as to reduce the quantity of detection electrical contacts of the semiconductor chips 700A and 700B. For example, the memory control circuit 720C can generate the chip connection signals as a binary code. In such case, the chip connection signals can use three bits to represent the total quantities of semiconductor chips from 1 to 8. Therefore, while each of the semiconductor chips 600A, 600B, and 600C may include 7 detection electrical contacts to detect the 8 different situations, each of the semiconductor chips 700A and 700B needs only three detection electrical contacts to receive the chip connection signals generated by the memory control circuit 720C. As a result the quantity of detection electrical contacts of each semiconductor chip can be reduced.

Figure 10:
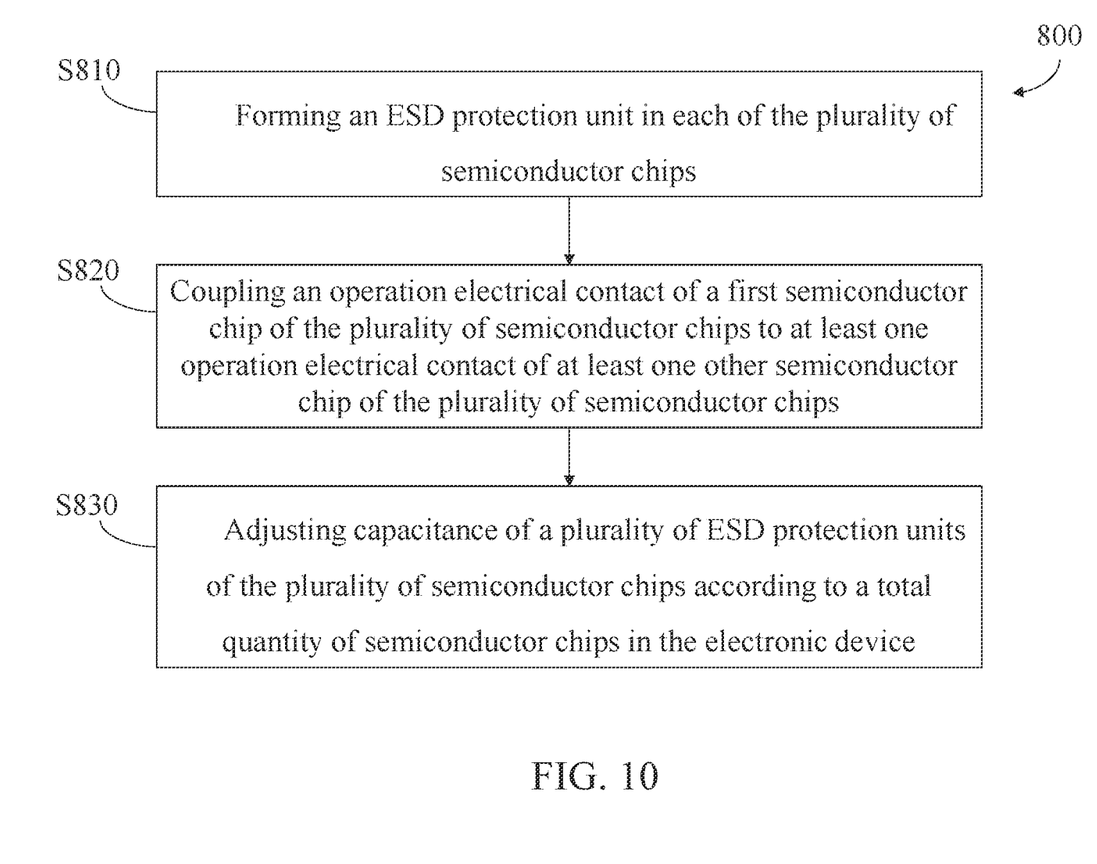
FIG. 10 shows a flow chart of an ESD protection method for the electronic device.

FIG. 10 shows a flow chart of an ESD protection method 800 for an electronic device. In some embodiments, the method 800 can be applied to the electronic device 50. For example, in step S810, the ESD protection units 530A1 to 530AN and 530B1 to 530BN can be formed in the semiconductor chips 500A and 500B. As shown in FIG. 6, each of the ESD protection units 530A1 to 530AN and 530B1 to 530BN is coupled between the voltage terminal VT and a corresponding operation electrical contact of the operation electrical contacts 510A1 to 510AN and 510B1 to 510BN. The voltage terminal VT can be coupled to the ground GND or the power voltage VDD. In some embodiments, the first ESD protection units 530A1 to 530AN and the second ESD protection units 530B1 to 530BN can be implemented by adopting the ESD protection unit 130A1 or 130B1 shown in FIG. 2, the ESD protection unit 230 shown in FIG. 3, the ESD protection unit 330 shown in FIG. 4, or the ESD protection unit 430 shown in FIG. 5 according to system requirements.

In addition, in step S820, the operation electrical contacts 510A1 to 510AN of the first semiconductor chip 500A can be coupled to the operation electrical contacts 510B1 to 510BN of the semiconductor chip 500B so that the memory circuits 520A and 520B can receive the same operation signals and perform operations in parallel. Furthermore, in step S830, the capacitance of the ESD protection units 530A1 to 530AN and 530B1 to 530BN of the semiconductor chips 500A and 500B can be adjusted according to a total quantity of semiconductor chips in the electronic device 50. For example, since each of the ESD protection units 530A1 to 530AN and 530B1 to 530BN includes a plurality of ESD protection elements coupled between the voltage terminal VT and a corresponding operation electrical contact of the operation electrical contacts 510A1 to 510AN and 510B1 to 510BN to provide discharge paths for ESD current, the logic circuits 550A and 550B can uncouple at least one of the ESD protection elements from the corresponding operation electrical contact or the voltage terminal VT by turning off some switches in the ESD protection units 530A1 to 530AN and 530B1 to 530BN or burning out some fuses in the ESD protection units 530A1 to 530AN and 530B1 to 530BN. As a result, the capacitance of the ESD protection units 530A1 to 530AN and 530B1 to 530BN of the semiconductor chips 500A and 500B can be adjusted.

In addition, in some embodiments, step S830 can be performed when the electronic device 50 is powered up for the first time. For example, after the electronic device 50 completes the package of the semiconductor chips 500A and 500B, the electronic device 50 needs to be tested before shipping to customers. In some embodiments, step S830 can be performed during the test so the customer can receive the electronic device 50 with the capacitance of the ESD protection units 530A1 to 530AN and 530B1 to 530BN being adjusted properly in advance.

In summary, the semiconductor chip, the electronic device, and the ESD protection method for the electronic device thereof can adjust capacitance of ESD protection units according to system requirements. Therefore, when multiple semiconductor chips are stacked or coupled to together for parallel operations, the signal distortion caused by the capacitance of the ESD protection units of those semiconductor chips can be mitigated, thereby shortening the rise time and the fall time of the signals and improving the transmission quality of the signals. Furthermore, since the semiconductor chips can be notified of the existence of other semiconductor chip in the electronic device, the capacitance of the ESD protection units can be adjusted accordingly and automatically.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor chip, comprising:
an operation electrical contact configured to receive an operation signal; and
a detection electrical contact configured to receive a first chip connection signal;
an electrostatic discharge (ESD) protection unit coupled to the operation electrical contact; and
a logic circuit coupled to the detection electrical contact, and configured to adjust capacitance of the ESD protection unit according to at least the first chip connection signal;
wherein the ESD protection unit comprises:
a first ESD protection element coupled between the operation electrical contact and a voltage terminal;
a second ESD protection element; and
a control circuit coupled in series with the second ESD protection element between the operation electrical contact and the voltage terminal;
wherein the voltage terminal is coupled to a ground or a power voltage.

2. The semiconductor chip of claim 1, further comprising:
a memory circuit configured to perform operations according to at least the operation signal received by the operation electrical contact.

3. The semiconductor chip of claim 1, further comprising:
a notification electrical contact configured to transmit a second chip connection signal; and
the logic circuit is further configured to generate the second chip connection signal to the notification electrical contact when the semiconductor chip is powered up.

4. The semiconductor chip of claim 1, wherein the control circuit comprises a switch, and the logic circuit is configured to turn on or turn off the switch for adjusting the capacitance of the ESD protection unit.

5. The semiconductor chip of claim 1, wherein the control circuit comprises a fuse, and the logic circuit is configured to burn out the fuse to decrease the capacitance of the ESD protection unit.

6. An electronic device comprising:
a first semiconductor chip comprising:
a first operation electrical contact;
a first detection electrical contact;
a first electrostatic discharge (ESD) protection unit coupled to the first operation electrical contact; and
a first logic circuit coupled to the first detection electrical contact, and configured to adjust capacitance of the first ESD protection unit according to at least a first chip connection signal received by the first detection electrical contact;
a second semiconductor chip comprising:
a second operation electrical contact coupled to the first operation electrical contact;
a second detection electrical contact;
a second electrostatic discharge (ESD) protection unit coupled to the second operation electrical contact; and
a second logic circuit coupled to the second detection electrical contact, and configured to adjust capacitance of the second ESD protection unit according to at least a second chip connection signal received by the second detection electrical contact;
wherein the first ESD protection unit comprises:
a first ESD protection element coupled between the first operation electrical contact and a voltage terminal;
a second ESD protection element; and
a control circuit coupled in series with the second ESD protection element between the first operation electrical contact and the voltage terminal;
wherein the voltage terminal is coupled to a ground or a power voltage.

7. The electronic device of claim 6, wherein:
the first semiconductor chip further comprises first notification electrical contact couple to the second detection electrical contact of the second semiconductor chip, and configured to transmit the second chip connection signal; and
the first logic circuit is further configured to generate the second chip connection signal to the first notification electrical contact.

8. The electronic device of claim 7, wherein:
the second semiconductor chip further comprises a second notification electrical contact coupled to the first detection electrical contact of the first semiconductor chip, and configured to transmit the first chip connection signal; and
the second logic circuit is further configured to generate the first chip connection signal to the second notification electrical contact.

9. The electronic device of claim 6, wherein:
the first semiconductor chip further comprises a first memory circuit configured to perform operations according to at least an operation signal received by the first operation electrical contact; and
the second semiconductor chip further comprises a second memory circuit configured to perform operations according to at least the operation signal.

10. The electronic device of claim 9, further comprising:
a third semiconductor chip coupled to the first detection electrical contact of the first semiconductor chip and the second detection electrical contact of the second semiconductor chip, wherein the third semiconductor chip comprises a memory control circuit configured to control the first memory circuit and the second memory circuit, and generate the first chip connection signal and the second chip connection signal.

11. The electronic device of claim 10, wherein:
the memory control circuit is configured to generate the first chip connection signal and the second chip connection signal according to a total quantity of semiconductor chips in the electronic device that comprise memory circuits receiving the same operation signal and operating in parallel.

12. The electronic device of claim 6, wherein the control circuit comprises a switch, and the first logic circuit is configured to turn on or turn off the switch for adjusting the capacitance of the first ESD protection unit.

13. The electronic device of claim 6, wherein the control circuit comprises a fuse, and the first logic circuit is configured to burn out the fuse to decrease the capacitance of the first ESD protection unit.

14. The electronic device of claim 6, further comprising a substrate, wherein the first semiconductor chip is disposed on the substrate, and the second semiconductor chip is stacked on the first semiconductor chip.

15. An electrostatic discharge (ESD) protection method for an electronic device, the electronic device comprising a plurality of semiconductor chips, and the method comprising:
forming an ESD protection unit in each of the plurality of semiconductor chips, wherein the ESD protection unit is coupled between a voltage terminal and an operation electrical contact of the each of the plurality of semiconductor chips, wherein the voltage terminal is coupled to a ground or a power voltage; wherein the ESD protection unit comprises a first ESD protection element coupled between the operation electrical contact and the voltage terminal; a second ESD protection element; and a control circuit coupled in series with the second ESD protection element between the operation electrical contact and the voltage terminal; where in the voltage terminal is coupled to a ground or a power voltage;
coupling a first operation electrical contact of a first semiconductor chip of the plurality of semiconductor chips to at least one operation electrical contact of at least one other semiconductor chip of the plurality of semiconductor chips; and
adjusting capacitance of a plurality of ESD protection units of the plurality of semiconductor chips according to a total quantity of semiconductor chips in the electronic device.

16. The method of claim 15, wherein a first ESD protection unit of the first semiconductor chip comprises a plurality of ESD protection elements coupled between the first operation electrical contact of the first semiconductor chip and the voltage terminal, and adjusting the capacitance of the plurality of ESD protection units of the plurality of semiconductor chips according to the total quantity of semiconductor chips in the electronic device comprises:
   uncoupling at least one of the plurality of ESD protection elements from the first operation electrical contact or the voltage terminal.

17. The method of claim 15, wherein adjusting the capacitance of the plurality of ESD protection units of the plurality of semiconductor chips according to the total quantity of semiconductor chips in the electronic device is performed when the electronic device is powered up for a first time.

18. The method of claim 15, wherein each of the plurality of semiconductor chips comprises a memory circuit.

* * * * *